United States Patent
Li et al.

(10) Patent No.: US 6,188,920 B1
(45) Date of Patent: Feb. 13, 2001

(54) HIGH PERFORMANCE (BI,PB)$_2$SR$_2$CA$_2$CU$_3$OY COMPOSITES

(75) Inventors: Qi Li, Waltham; William J. Michels, Brookline; Ronald D. Parrella, Natick; Gilbert N. Riley, Jr., Marlborough; Mark D. Teplitsky, Westborough; Steven Fleshler, Brookline, all of MA (US)

(73) Assignee: American Superconductor Corporation, Westborough, MA (US)

( * ) Notice: Under 35 U.S.C. 154(b), the term of this patent shall be extended for 0 days.

(21) Appl. No.: 09/137,733

(22) Filed: Aug. 21, 1998

Related U.S. Application Data

(62) Division of application No. 08/651,169, filed on May 21, 1996, now Pat. No. 5,798,318.

(51) Int. Cl.$^7$ ............................ H01B 12/00; H01L 39/12
(52) U.S. Cl. ...................... 505/230; 505/231; 174/125.1
(58) Field of Search ................................ 505/121, 785, 505/124, 230, 231; 174/125.1

(56) References Cited

U.S. PATENT DOCUMENTS

| | | |
|---|---|---|
| 5,376,623 | 12/1994 | Tasi et al. . |
| 5,430,008 | 7/1995 | Morris . |
| 5,851,957 * | 12/1998 | Podtburg et al. ................... 505/510 |
| 5,908,812 * | 6/1999 | Cotton et al. ...................... 505/230 |

FOREIGN PATENT DOCUMENTS

| | | |
|---|---|---|
| 0 448 463 A1 | 9/1991 | (EP) . |
| 0 630 873 A1 | 12/1994 | (EP) . |
| WO 91/00622 | 1/1991 | (WO) . |
| WO 94/23459 | 10/1994 | (WO) . |
| WO 96/14655 | 5/1996 | (WO) . |

OTHER PUBLICATIONS

Y. Yaroskavsky et al. "Doping of BiSrCaCuO Compounds with (V+Y), As, Sb, Pb, Cr and Ge" *Physica C* 209:179–182 (1993).

Y. Li et al. "Effect of V, Nb, and Ta Doping on the 2223 Phase Formation and the Crystal Structure in the BiSrCaCuO System" *Journal of Solid State Chemistry* 113:176–181 (1994).

J.C. Grivel and R. Flukiger "A study of the stability of the (Bi,Pb)$_2$Sr$_2$Ca$_2$Cu$_3$O$_x$ phase in Ag–sheathed tapes" *Physica C* 235–240:505–506 (1994).

M. Däumling et al. "Phase Coexistence and Critical Temperatures of the (Bi,Pb)$_2$Sr$_2$Ca$_2$Cu$_3$O$_x$ Phase under Partial Pressures of Oxygen between $10^{-3}$ and 0,21 bar with and without Additions of Silver" *J. Mater. Res.* __(199_).

S. Kobayashi et al., "University in Magnetic Field Dependencies of Critical Current for Ag–Sheathed Bi–2223 Superconducting Tapes" *Proceedings ISS '95* .

(List continued on next page.)

Primary Examiner—Mark Kopec
(74) Attorney, Agent, or Firm—Clark & Elbing LLP; Mary Rose Scozzafava

(57) ABSTRACT

The present invention provides a (Bi,Pb)SCCO-2223 oxide superconductor composite which exhibits improved critical current density and critical current density retention in the presence of magnetic fields. Retention of critical current density in 0.1 T fields (77 K, ⊥ ab plane) of greater than 35% is disclosed. Significant improvements in oxide superconductor wire current carrying capacity in a magnetic field are obtained by subjecting the oxide superconductor composite to a post-processing heat treatment which reduces the amount of lead in the (Bi,Pb)SCCO-2223 phase and forms a lead-rich non-superconducting phase. The heat treatment is carried out under conditions which localize the lead-rich phase at high energy sites in the composite.

32 Claims, 13 Drawing Sheets

OTHER PUBLICATIONS

J.A. Parrell and D.C. Larbalstier "Cooling Rate Effects on the Microstructure, Critical Current Density, and $T_c$ Transistion of One–and Two–Powder BSCCO–2223 Ag–Sheathed Tapes" *IEEE Transactions on Applied Superconductivity* 5(2):1275–1278 (Jun., 1995).

W.S. Um et al. "Influence of Oxygen Deficiency on Electrical Properties in the Superconductor $(Bi, Pb)_2Sr_2Ca_2Cu_3O_y$ Phase" *Jpn. J. Appl. Phys.* 32:3799–8308 (Sep. 1993).

W.S. Um et al. "Oxygen Behavior in the Superconductor $(Bi, Pb)_2Sr_2Ca_2Cu_3O_y$ Phase Studied by I–Ray Photoelectron Spectroscopy" *Jpn. J. Appl. Phys.* 31:775–779 (Mar. 1992).

S. Kishida et al. "The Preparation of 110 K Pb–Doped Bi–Sr–Ca–Cu–O Superconducting Ceramics in Various Oxygen–Reduced Atmospheres" *Phys. Stat. Sol.* A124:K117–K121 (1991).

W. Zhu and P.S. Nicholson "The influence of oxygen partial pressure and temperature on Bi–Pb–Sr–Ca–Cu–O 110 K superconducting phase formation and its stability" *J. Appl. Phys.* 73(12):8423–8428 (Jun., 1993).

Y. Idemoto et al. "Oxygen nonstoichiometry of 223 phase Bi–Pb–Sr–Ca–Cu–O system superconducting oxide" *Physica C* 181:171–178 (1991).

J. Wang et al. "Effect of Post–annealing on $T_c$ in Pb–doped Bi–2223 Superconductors" *Advances in Superconductivity V* Proceedings of the 5th International Symposium on Superconductors (ISS '92) Nov. 16–19, 1992 Kobe, Japan.

K.W. Lay "Post Sintering Oxygen Pressure Effects on the Jc of BPSCCO–Silver Clad Tapes" *Mat. Res. Symp.* 275:651–661 (1992).

* cited by examiner

HIGH PERFORMANCE (BI,PB)$_2$SR$_2$CA$_2$CU$_3$OY COMPOSITES

This application is a DIV of Ser. No. 08/651,169, filed May 21, 1996, now U.S. Pat. No. 5,798,318.

FIELD OF THE INVENTION

The invention relates to high performance oxide superconductor composites exhibiting improved J$_c$ retention in the presence of a magnetic field. The invention further relates to a method for post-formation processing of an oxide superconductor composite to improve electrical performance.

BACKGROUND OF THE INVENTION

In order to obtain high electrical performance in (Bi,Pb)$_2$Sr$_2$Ca$_2$Cu$_3$O$_y$ ((Bi,Pb)SCCO-2223) high temperature superconducting composites, highly phase pure (Bi,Pb)SCCO-2223 with perfect texture and superior grain connectivity is desired. "Texture" refers to the degree of alignment of the oxide superconductor grains along the direction of current flow. "Connectivity" refers to the positional relationship of the oriented oxide superconductor grains, the nature of the grains boundaries and the presence of phase impurities disrupting intergrain connection.

Many parameters must be controlled and optimized during the fabrication and thermomechanical processing of (Bi,Pb)SCCO-2223 tapes in order to obtain satisfactory electrical properties. Electrical properties may be grouped into two categories: intragranular electrical properties and intergranular electrical properties. Intragranular electrical properties are those that are effected by changes within individual oxide superconductor grains. Critical transition temperatures (T$_c$) is one electrical property which is predominantly intragrain. Critical current density (J$_c$) and critical current retention (J$_{ret}$) also has an intragrain component. Intergranular electrical properties are those which relate to the transport of a supercurrent across oxide superconducting grain boundaries and depend upon good intergrain connectivity. Critical current density (J$_c$) and critical current retention in a magnetic field (J$_{ret}$) have significant intergrain character.

In references too numerous to identify individually, the effects of powder composition, mechanical deformation, and heat treatment time, temperature and atmosphere on oxide superconductor formation have been studied. Not surprisingly, these studies have shown that heat treatment affects the rate of formation of the superconductor phase, the quality of the superconductor phase and the presence of secondary, non-superconducting phases. Thus, the heat treatment used in the formation of the oxide superconductor phase is important to the overall performance of the oxide superconductor composite.

Post-formation heat treatments have been investigated as a means for modifying the intragranular structure to boost performance properties of the oxide superconductor phase. Intragrain factors which affect electrical properties include the presence or absence of defects in the superconductor phase, and the phase purity of the superconductor phase and stoichiometric modifications thereof which may improve or degrade superconducting behavior. "Post-formation", as that term is used herein, means processing of the oxide superconductor after formation of the desired oxide superconductor phase from precursor oxide phases is substantially complete.

Typical post-processing heat treatments include annealing to alter the oxygen stoichiometry of the oxide superconductor phase, such as described by E. Ozdas and T. Firat in "Oxygenation Intercalation and Intergranular Coupling in the 110-K Bi$_{1.7}$Pb$_{0.3}$Sr$_{1.8}$Ca$_2$Cu$_{2.8}$O$_{9.45+\delta}$ Superconductor" (*Phys. Rev. B* 48(13):9754–9762 (October, 1993)) and Idemoto et al. in "Oxygen Nonstoichiometry of 2223 Phase Bi—Pb—Sr—Ca—Cu—O System Superconducting Oxide" (*Physica C* 181:171–178 (1991)). They reported on the effect of heating (Bi,Pb)SCCO-2223 powders at temperatures from 500° C. to 800° C. and oxygen pressures of 0.2 to 10$^{-3}$ atm. Idemoto et al. observed the formation of secondary phase Ca$_2$PbO$_4$ and evaporation of PbO, while Ozdas and Firat reported inhomogeneities forming at oxide superconductor grain boundaries.

Um et al. (*Jpn. J. Appl. Phys.* 32: 3799–3803 (1993)) investigated the effect of a post-sintering anneal on (Bi,Pb)SCCO-2223 powders. They observe that T$_c$ is affected by the anneal temperature and oxygen pressure and found annealing at temperatures below 700° C. and at oxygen partial pressure of 0.01 atm to provide optimized T$_c$. Um et al. noted that the superconducting phase decomposes at temperatures higher than 700° C. Wang et al. (*Advances in Supercond. V* (1992)) also found that post-annealing under vacuum at 790° C. improved T$_c$ of (Bi,Pb)SCCO-2223 oxide superconductor powders.

These prior art references investigate the intragranular electrical properties of oxide superconductor powders and the authors are primarily interested in T$_c$ optimization. Oxide powders have no intergranular boundaries because of the random loose-packed nature of powder, and they provide no insight into the optimization of electrical transport properties (J$_c$, J$_{ret}$) of (Bi,Pb)SCCO-2223 superconductor current carriers, such as wires, tapes and the like.

Interestingly, the above-mentioned prior art noted the decomposition of the superconducting oxide phase and formation of secondary phases while optimizing intragranular electrical properties. Conventional wisdom would suggest that microstructures containing a non-superconducting secondary phase are undesirable because these particles disrupt local alignment of the BSCCO-2223 grains and decrease superconducting volume fraction in the composite. Thus, prior investigations have suggested that it is highly desirable to reduce the amount of secondary phases to as low a level as possible.

There has been little or no investigation of conditions which optimize the interconnectivity of (Bi,Pb)SCCO-2223 superconductor grains in a silver sheathed wire or which investigate its retention of critical current in the presence of a magnetic field. In the case of silver sheathed high temperature superconducting wires, good intergranular connectivity is critical to performance, yet processing is complicated by the need to move oxygen through the silver to the oxide superconductor. Observations made for oxide superconductor powders, which are an open system exposed directly to the furnace atmosphere and which systems do not include silver/oxygen interfaces, may not apply to silver sheathed tapes and the like.

The effects of cooling on the electrical properties of the oxide superconductor composite has been investigated by Lay et al. in "Post-Sintering Oxygen Pressure Effects on the Jc of BPSCC-Silver Clad Tapes" (*Mat. Res. Symp. Proc.* 275:651–661 (October, 1992). Lay et al. reported cooling in air at 1° C./min resulted in a J$_c$ (77K, 0 T) increase over tapes cooled at 3° C./min. Lay et al. also noted that holding the (Bi,Pb)SCCO-2223 samples at temperatures of 810° C. or 780° C. in reducing atmospheres improved J$_c$.

While critical current (I$_c$) and critical current density (J$_c$) in self-fields may be useful indications of the quality of an oxide superconductor composite, an important performance parameter for in-field operations of oxide superconducting devices is their ability to retain their superconducting transport properties in the presence of a magnetic field. Many applications using oxide superconducting wires must be accomplished in the presence of its own induced magnetic field or in applied field ranging from 0.01 T to 100 T. Superconducting properties degrade dramatically in even relatively weak fields. Oxide superconductors show their most dramatic loss in critical current capacity perpendicular to the ab plane. Parallel to the ab plane, capacity loss is only a few percent. For example, weakly linked yttrium-barium-copper oxide superconductor (YBCO) exhibits a ten-fold drop in $J_c$ in magnetic field strengths of 0.01 T (B ⊥ oxide superconductor tape plane). Conventionally processed BSCCO-2223 loses the majority of its critical current capacity in a 0.1 T field (77 K, ⊥ tape plane). Even a few percent increase in critical current retention would have a dramatic effect on wire performance.

Thus, there remains a need to optimize the intergrain connectivity of high temperature superconducting wires and tapes so as to improve current carrying performance. Preferably, processing of an oxide superconductor wire or tape would enhance the intragranular properties of the conductor without detriment to the intergranular transport properties of the conductor. Due to secondary phase formation under conditions which optimize intragranular electrical properties, it is desirable to process the superconductor in a manner which minimizes the formation and/or detrimental effect of secondary phases on intergrain connectivity.

It is the object of the present invention to provide an oxide superconductor article with improved critical current retention and/or improved critical current density in the presence of a magnetic field.

It is a further object of the present invention to provide a method of treating the oxide superconductor composition to improve critical current retention and/or critical current density.

It is yet a further object of the present invention to increase flux pinning sites and/or intragranular coupling in a (Bi,Pb)SCCO-2223 oxide superconductor composite.

It is yet a further object of the invention to improve grain interconnectivity by reducing formation and/or the detrimental effect of secondary phase formation.

It is yet a further object of the present invention to provide a method form obtaining optimal intragranular properties of an oxide superconductor wire or tape, while minimizing the detrimental effects to intergranular transport properties.

These and other objection of the invention are accomplished by the invention as set forth hereinbelow.

SUMMARY OF THE INVENTION

The present invention provides a (Bi,Pb)SCCO-2223 oxide superconductor composite which exhibits improved critical current density ($J_c$ or $J_e$) and improved critical current retention ($J_{ret}$) the presence of magnetic fields. Retention of critical current density in 0.1 T fields (77 K, ⊥ to the tape plane) of up to about 40% have been observed; and critical current retention of greater than about 30% is typical. In preferred embodiments, critical current retention is in the range of about 15% to about 50%, and preferably is in the range of about 20% to about 40%. The improved critical current retention is accompanied by the localization of a lead-rich secondary phase at high energy sites within the composite. The present invention recognizes that, contrary to the commonly held belief that secondary non-superconducting phases are detrimental to superconducting electrical properties, enhanced critical current and critical current retention are obtained from a composite containing a lead-rich non-superconducting secondary phase.

In one aspect of the invention, a (Bi,Pb)SCCO-2223 oxide superconductor composite wire is provided having a (Bi,Pb)SCCO-2223 oxide superconductor filament substantially supported in a noble metal phase. The filament comprises a lead-rich secondary phase and the wire possess a $J_{ret}$ at 0.1 T in the range of greater than 35% (77 K, ⊥ ab plane) when tested over a current carrying distance of 10 cm. The lead-rich secondary phase may be localized at high energy sites. The (Bi,Pb)SCCO-2223 may be lead deficient. In preferred embodiments, the (Bi,Pb)SCCO-2223 oxide superconductor phase comprises Bi:Pb:Sr:Ca:Cu in the nominal stoichiometry of 2.2(±0.05):0.4(±0.04):2.3(±0.06): 2.3(±0.04):3.0(±0.15). Unless otherwise noted, all references are to atomic percent. The composite may additionally include a lead-rich secondary phase comprising Bi:Pb:Sr:Ca:Cu in the nominal stoichiometry of 0.9(±0.09):1.1 (±0.21):1.6(±0.06): 1.7(±0.08):1.0(±0.23). In preferred embodiments, the lead-rich secondary phase is formed in a relative fraction in the range of 0.002 to about 0.5, and preferably about 0.01 to about 0.5.

The present invention further contemplates a (Bi,M)SCCO-2223 oxide superconductor wire including a (Bi,M)SCCO-2223 oxide superconductor filament supported in a noble metal phase. M is may include Pb, Tl, Sb, Sn, Te, Hg, Se, As and mixtures thereof. The wire characterized in that when tested over a current carrying distance of 10 cm, the wire possess a $J_{ret}$ at 0.1 T of greater than 35% (77 K, ⊥ ab plane).

Significant improvements in oxide superconductor wire current carrying capacity in a magnetic field are obtained by subjecting the oxide superconductor wire containing (Bi,Pb)SCCO-2223 to a post-processing heat treatment which reduces the lead content in the (Bi,Pb)SCCO-2223 phase by an amount in the range of about 5 wt % to about 50 wt %, and typically to about 40 wt %, and localizes the exsolved lead in a lead-rich secondary phase outside the superconducting grain colonies and/or at other high energy sites in the composite. Reduction of lead in the (Bi,Pb)SCCO-2223 phase improves intragranular electrical properties. When the heat treatment is conducted under conditions which localize secondary phases formed thereby at high energy sites, the secondary phases do not significantly degrade the intergranular transport properties of the composite.

The invention calls for the modification of the lead content of the a (Bi,Pb)SCCO-2223 superconducting phase during processing of a (Bi,Pb)SCCO-2223 oxide superconductor composite. The lead content varies such that the lead content of the (Bi,Pb)SCCO-2223 superconducting phase is in the range of 3% to 8% preferably in the range of 4 wt % to about 6 wt %, and preferably 6.5 wt %, during formation of the (Bi,Pb)SCCO-2223 phase and such that the lead content of the (Bi,Pb)SCCO-2223 superconducting phase is reduced up to 50% during post formation processing of the oxide superconductor phase. This results in the optimization of the product superconductor electrical properties.

The method of the invention also contemplates heating the oxide superconductor composite under oxidizing conditions, said conditions sufficient to oxidize a portion of $Pb^{2+}$ present in (Bi,Pb)SCCO-2223 into $Pb^{4+}$ and to localize the $Pb^{4+}$ in a secondary phase at high energy sites of the composite.

The term "wire" is used herein to mean any of a variety of geometries having an elongated dimension suitable for carrying current, such as but not limited to wires, tapes, strips and rods.

By "fully formed (Bi,Pb)SCCO-2223", "desired (Bi,Pb) SCCO-2223", and "final (Bi,Pb)SCCO-2223" as those terms are used herein, it is meant an oxide superconductor phase in which substantially all of the precursor oxide has been converted into the desired (Bi,Pb)SCCO-2223 phase. There is no further processing into a different oxide superconductor phase. The (Bi,Pb)SCCO-2223 may be obtained according to the methods described herein or according to other prior art methods demonstrated to complete conversion of the precursor oxides to (Bi,Pb)SCCO-2223.

"Critical current density retention", $J_{ret}$, as that term is used herein means the ratio of the critical current density of the composite in an applied field over the critical current density of the composite in the absence of an applied field (self field or zero field). The sample will generate its own self field, but that field is expected to be at least an order of magnitude less than the applied field.

High energy sites include high angle c-axis tilt boundaries, pores, interfaces between the superconducting and secondary phases and edge boundaries for the superconducting phase. Oxide grains having a misorientation of greater than 10° angular deviation from perfect alignment of adjacent grains have a large relative proportion of high energy sites.

The present invention is readily scalable and can be used to process long lengths of oxide superconductor wire, in contrast to techniques such as irradiation, which are expected to introduce flux pinning and other site defects into the material.

BRIEF DESCRIPTION OF THE DRAWING

The invention is described with reference to the Drawing, which is presented for the purpose of illustration only and is no way intended to be limiting of the invention, and in which.

DETAILED DESCRIPTION OF THE INVENTION

Figure 1A:
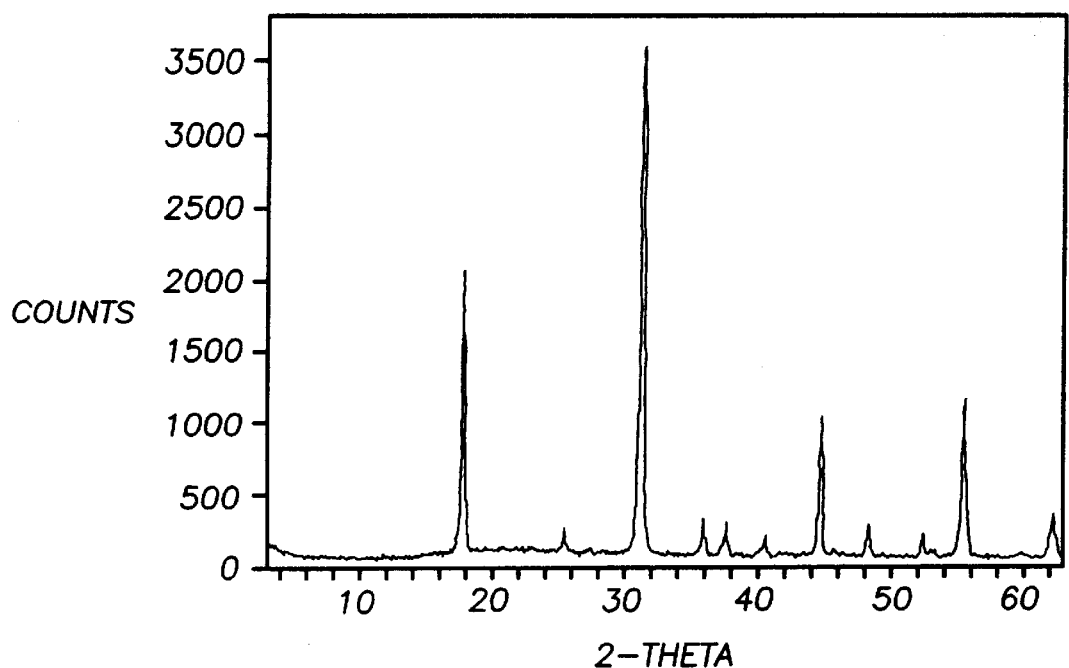
FIG. 1 are X-diffraction patterns of (a) a hexagonal lead-rich secondary phase and (b) a (Bi,Pb)SCCO-2223 composite of the invention including the hexagonal lead-rich secondary phase.

The critical current retention of BSCCO-2223 in a magnetic field is relatively poor at high temperatures, e.g., 77 K. For example, conventionally processed BSCCO-2223 loses the majority of its critical current capacity in a 0.1 T field (77 K, ⊥ tape plane). Critical current retention may be improved in two ways. In one method, defects can be introduced into the superconductor phase that directly interact with magnetic flux vortexes and impede their motion, so-called flux pinning. Defects may be particles giving rise to point, line, plane or volume defects (zero, one, two or three dimensional defects) or particles which create coherency strain fields or differential coefficients of thermal expansion. In another method, the crystal lattice of the oxide superconductor itself is modified to improve the coupling of the carriers responsible for superconducting behavior, so-called intrinsic coupling. For example, carrier density may be modified by changing the oxide superconductor stoichiometry. Note that both of these mechanisms are intragranular.

In the case of high temperature superconducting wires, in which multifilaments of oxide superconductor are sheathed in a silver sheath, good intergranular connectivity is important to maintain effective current carrying capacity along the wire length. Good intergranular connectivity must be maintained, even as the oxide superconductor wire is subjected to processes which enhance intragranular properties.

The prior art discussed hereinabove enhances intragranular properties (such as $T_c$) with a resultant decomposition of the oxide superconductor phase and formation of a secondary phase. Thus, previous efforts to enhance intragranular superconducting properties have indicated that intergranular connectivity is substantially degraded as intragranular superconducting properties are enhanced.

Thus, some prior art investigations into post-sintering conditions have lead investigators to recommend regimes where formation of secondary phases is minimized and intragranular properties such as $T_c$ are optimized. This may, however, be a processing regime which is not well suited to optimization of other electrical properties, in particular, critical current retention. For example, Um recommends post-sintering at temperatures of 500–700° C. at partial oxygen pressures of 0.01 atm. As is described herein, this processing regime may enhance $T_c$ and avoid secondary phase formation, but it does not enhance critical current retention.

The present invention has recognized for the first time that processing conditions which optimize intragranular superconducting properties such as $T_c$ or critical current retention in a magnetic field ($J_{ret}$) are different than those processing conditions which optimize $J_c$ at self field or zero field, a property having a dominant intergranular connectivity characteristic. The method of the present invention recognizes the need to balance these competing processes and provides a heat treatment which maximizes the desired intragranular electrical property, while minimizing the degradation of intergranular connectivity. The method includes heating a (Bi,Pb)SCCO-2223 oxide phase under conditions which modify the (Bi,Pb)SCCO-2223 phase to optimize intragranular electrical properties and to localize any secondary phase formed in post-processing heat treatments to regions of the oxide superconductor composite where it is benign to supercurrent flow, thereby optimizing intergranular connectivity.

In the case of sheathed BSCCO-2223 wires, the following issues need to be addressed when seeking to enhance intragranular properties without cost to grain interconnectivity.

Processing conditions (T, $P_{O2}$, t) must be sufficient to diffuse oxygen through the substantially dense ceramic filaments and the metallic sheath. This is mainly a kinetic effect and oxygenation can be accomplished, for example in a silver-based alloy sheathed system, by use of temperatures greater than 500° C., at times in excess of 1 hours and oxygen partial pressures of greater than 0.01 atm.

Processing conditions must also be selected such that secondary phase material, when formed, occupies a position in the microstructure which is benign to supercurrent flow in the wire. Secondary phases may arise in several possible situations. Oxygen stoichiometry change may lead to a change in cationic states within the oxide superconductor, resulting in material being exsolved (expelled) from the superconductor phase. A likely candidate for exsolution is lead (Pb), which may undergo an oxidation valance change from $Pb^{2+}$ to $Pb^{4+}$ during exsolution. Alternatively, changes in the thermodynamic state may cause decomposition of the oxide superconducting phase. Some types of phase decomposition may result in enhanced flux-pinning. For example, very small oxide secondary phases (10–5000 Å) within the superconductor oxide phase on the order of the coherence length of the superconducting electron pairs can pin magnetic vortices. In either case, it is desirable that secondary phases that do not create vortices pinning occupy a position in the oxide superconductor composite where they are substantially benign to supercurrent flow.

Regardless of the driving force to the intragranular change in the oxide superconducting phase, a secondary phase is formed. In order to reap the benefits of the intragranular phase modification of the oxide superconductor, the secondary phase desirably does not disrupt the intergranular connectivity of the composite.

Applicants have discovered that by careful control of the processing conditions by which the oxide superconductor phase modification occurs, formation of the secondary phase may be localized at high energy sites. Since supercurrent flow occurs preferably at low energy sites, grain interconnectivity is not disrupted. Localization of secondary phases at high energy sites may be accomplished by balancing the energy of decomposition (of the oxide superconductor phase to the secondary phase) and the rate of entropy increase of a secondary phase at the various microstructural sites.

Decomposition in a closed materials system, such as a sheathed high temperature superconductor wire, has an associated energy. The magnitude of this energy depends upon the specific phases and the microstructure before and after decomposition. In the present case, BSCCO-2223 has a small thermodynamic state stability field, and is relatively difficult to form. As a result, there is a strong driving force for the decomposing of BSCCO-2223 during the transition from conditions of BSCCO-2223 formation to ambient conditions.

During "ramping" conditions (approach to formation conditions or return to ambient conditions), the principles of irreversible thermodynamics control microstructural evolution. This is in contrast to isothermodynamic state treatments in which the principles of equilibrium thermodynamics (minimization of the free energy of the system) control. A governing principle of irreversible thermodynamics is that the time rate of entropic increase is maximized. In the present case, one attempts to simultaneously control equilibrium and irreversible thermodynamic considerations in order to control microstructural evolution.

With respect to the microstructure, every structure within the closed materials system has some associated free energy. For example, the energy of a grain boundary increases as the number of broken chemical bonds associated with it increases. Thus, a high-angle grain boundary, where there is a greater degree of $PbO$—$PbO_2$ "bond mismatch" between neighboring grains, is likely to have a higher free energy than a low angle grain boundary. Other examples of high energy sites includes (a) high angle c-axis tilt boundaries, (b) pores, (c) interfaces between superconducting and secondary phases, and (d) surface boundaries (boundaries terminating perpendicular to the c-axis) for the superconducting phase. Examples of low energy sites within the superconducting composite include (a) within the superconducting grains, (b) c-axis twist boundaries (tilt=0), (c) c-axis boundary with the silver phase, (d) coincident site lattice boundaries and (e) twin boundaries.

Because the energy associated with high energy sites is high, there is a strong driving force to "grow" the decomposition products at that point which decreases overall free energy of the system. Thus, if time rate of entropic increase associated with the decomposition of the oxide superconductor phase is small, then the decomposition products will grow at high energy sites. However, if the time rate of entropic increase is high then decomposition products will form at low and high energy sites. Note that mass transfer to high energy sites is more substantial than mass transfer to low and high energy sites. A practical means to maintain a low time rate of entropic increase (so that high energy sites are favored) is to hold the article at a thermodynamic state that is close to, but outside that of, the desired superconductor. If the process state is far from the thermodynamic state of the desired superconductor, irreversible thermodynamics governs microstructural evolution.

Figure 13:
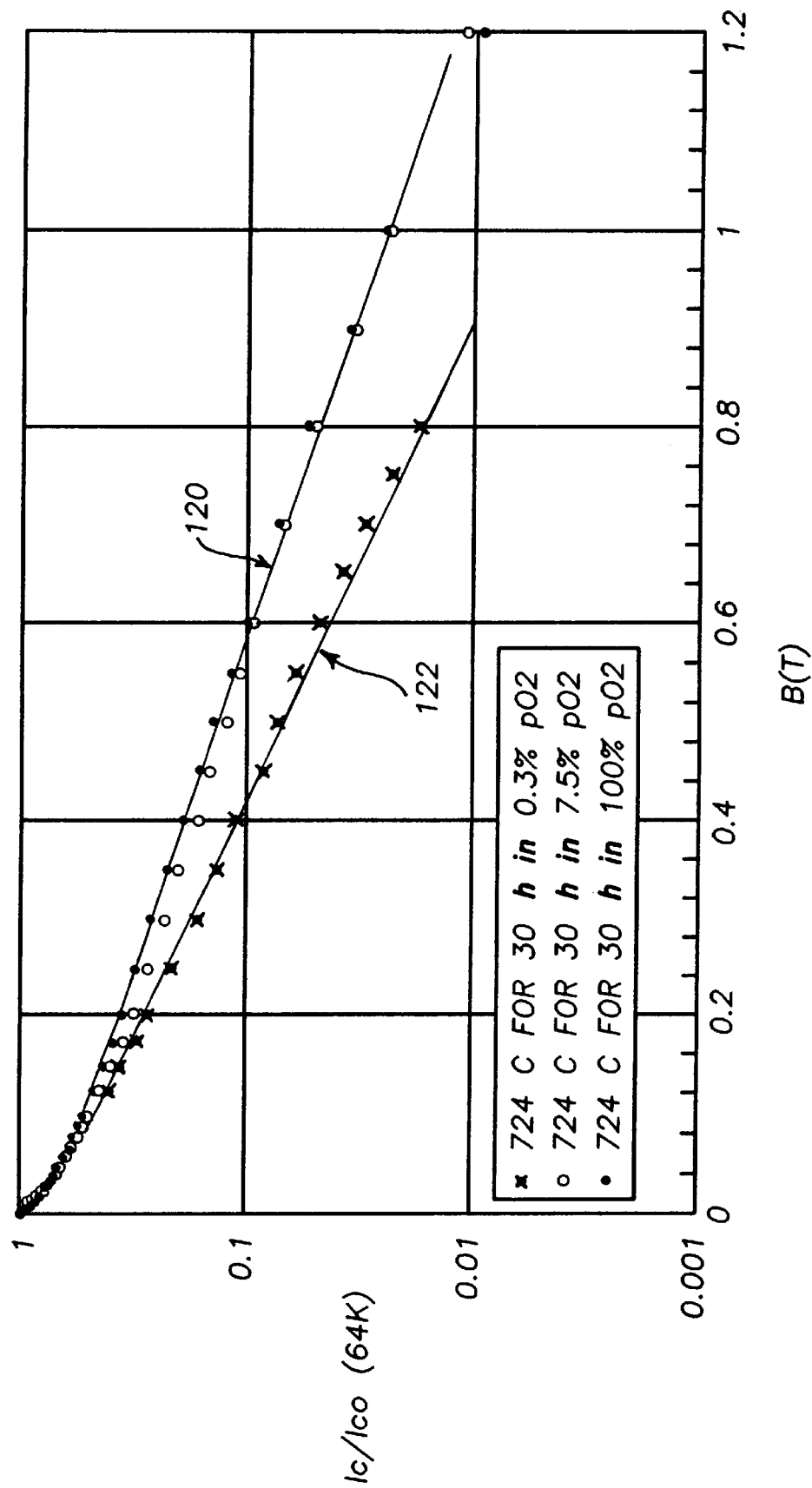
FIG. 13 is a plot of $J_{ret}$ v. B demonstrating the effect of heat treatment on critical current density retention above and below the lead-rich phase stability line.

It follows then that, in order to obtain a silver sheathed BSCCO-2223 wire with enhanced critical current and critical current retention, one processes the wire under conditions that are very close to the phase boundary between BSCCO-2223 and the decomposition phase, thereby minimizing the force driving secondary phase formation at low and high energy sites as indicated in FIG. 13. In prior art compositions, secondary phase growth occurs without selectivity at both low and high energy sites. In such instances, the rate of entropic increase is high and secondary phase growth is indiscriminate.

According to the invention, the BSCCO-2223 wire is heat treated in a processing space in which the decomposition products form at high energy sites. The decomposition reaction of interest is one which achieves the desired enhancement of intragranular properties. This processing space balances the irreversible and equilibrium thermodynamics and has the additional benefit of minimizing the absolute magnitude of decomposition. Thus, the heat treatment of the invention simultaneously minimizes the formation of the secondary phase and its detrimental effect to the electrical properties of the composite.

In one embodiment of the invention, modifications of the lead content in the oxide superconducting phase achieve the desired results. Under oxidizing conditions, lead is exsolved (expelled) from the oxide superconducting phase, presumably undergoing a change in valence state from 2+ to 4+. The exsolved lead forms a secondary phase which has a high lead content. The formation of the lead-rich non-superconducting phase is associated with the reduction of lead in the (Bi,Pb) SCCO-2223 oxide superconductor phase. Lead loss in (Bi, Pb)SCCO-2223 may be in the range of about 5 wt % to about 50 wt % lead. Preferably lead loss is in the range of about 15 wt % about 25 wt %. Lead loss is reported as a percentage of the amount of lead originally present in the (Bi,Pb)SCCO-2223. It is contemplated that other metal capable of +2 to +4 (or +1 to +3) valance state changes that are soluble in the oxide superconductor phase may be used according to the invention. Suitable cations include, but are in to way limited to, Pb, Tl, Sb, Te, Hg, Se, As and Sn.

Figure 1B:
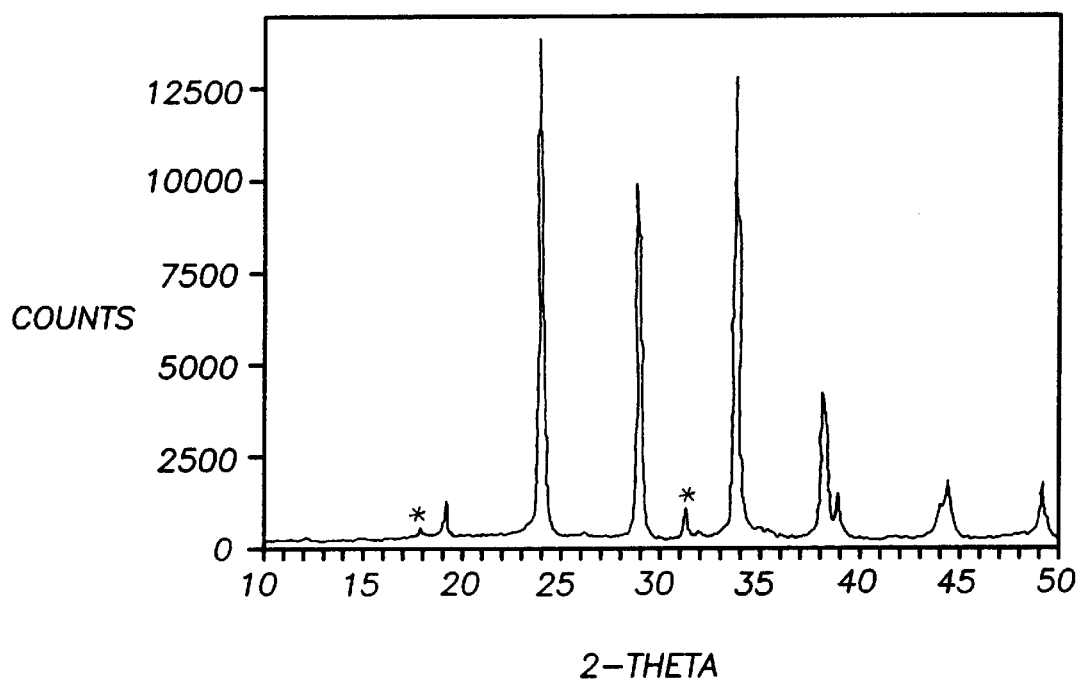

The lead-rich secondary phase has a hexagonal crystal structure. Although the crystal symmetry does not change, the chemical composition varies with the temperature of formation. For example, a lead-rich secondary phase formed at 724° C. has an elemental composition, Bi:Pb:Sr:Ca:Cu, of 1:1:2:2:1, whereas a lead-rich phase formed at 784° C. has an elemental composition of 1:2:2:3:1. Both hexagonal lead-rich phases have the same X-ray diffraction pattern, which is shown in FIG. 1a. The diffraction pattern corresponds to that catalogues in the JCPDS files as 44-0053. FIG. 1b is an X-ray diffraction pattern of a (Bi,Pb)SCCO-2223 composite of the invention including the lead rich secondary phase. Peaks marked with an asterisk are attributable to the secondary lead-rich phase. The remaining peaks are attributable to the BSCCO-2223 oxide superconductor. Flükiger et al. have previously observed this phase and the interested reader is directed to *Physica C* 235–240:505–506 (1994) for further information, herein incorporated by reference.

The marked improvement of critical current retention in the oxide superconductor wires of the present invention correlates to the reduction of lead content in the oxide superconducting phase. While not being bound to any particular theory of operation, it is hypothesized that the change in oxygen activity of lead (Pb) leads to a decrease in the lead content in the oxide superconductor. The altered stoichiometry may introduce oxygen defect sites which are effective flux pinning sites and/or change the intrinsic coupling. Flux pinning sites are known to improve critical current performance in a magnetic field.

Figure 2:
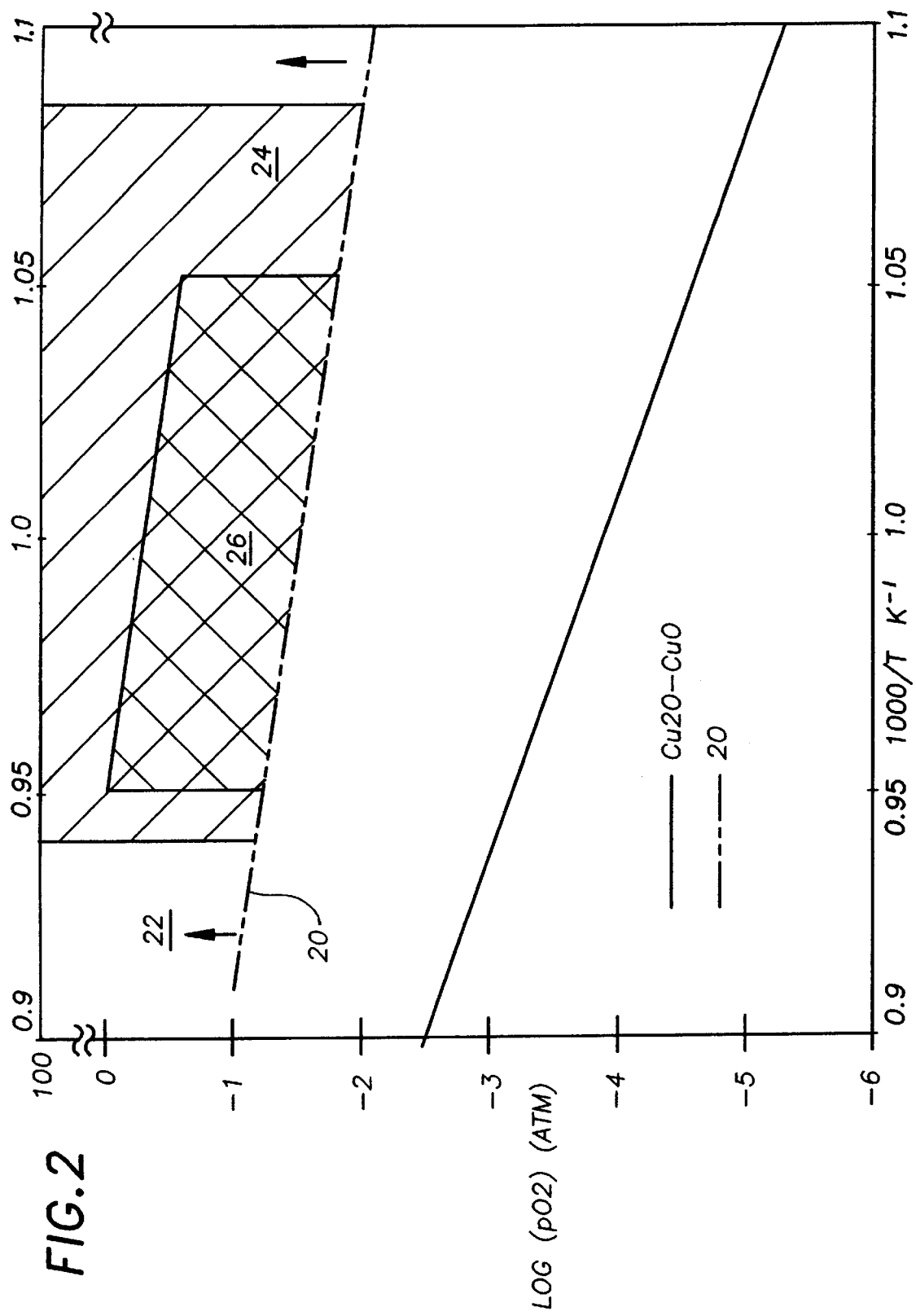
FIG. 2 is a plot of log $P_{O2}$ (atm) vs. 1000/T (K) showing a lead-rich phase reaction curve.

The heat treatment of the invention should satisfy both the kinetic and thermodynamic criteria set forth above, that is, the heat treatment should support material transport throughout the composite and should support oxidation of the divalent metal dopant in the BSCCO-2223 phase while remaining close to the stability line of the decomposition phase. A reasonable guideline in determining the appropriate processing conditions is to process under conditions of the unitary oxide stability phase, e.g.; $PbO-Pb_3O_4-PbO_2$ in the context of the appropriate multicomponent oxide phase. FIG. 2 is a plot of log $P_{O2}$ vs. 1000/K ($K^{-1}$) on which a calculated stability curve 20 for the lead-rich phase is shown. The region above the plot represents conditions which are oxidizing for $Pb^{2+}$, resulting in formation of the lead-rich phase. The temperature range is bounded one the low side by kinetic considerations and on the high side by concerns for indiscriminate mass transfer. In one embodiment of the invention, the heat treatment is conducted in a space 22 at pressures above the lead-rich phase reaction curve 20 over a temperature on the range of about 500° C. to 800° C. In a preferred embodiment, heat treatment is conducted in a space 24 above the lead-rich phase reaction curve 20 over a temperature in the range of about 790° C. to 630° C. and in a most preferred embodiment, the heat treatment is conducted in a space 26 at pressures above the lead-rich phase reaction curve 20 over a temperature on the range of about 650° C. to about 750° C. Upper limit on oxygen pressure is about 100 atm.

To summarize, heat treatment used according to the present invention may be in the range of 800° C. to about 500° C. at an oxygen content of 0.03 to 100 atm. Preferably the heat treatment is conducted at a temperature in the range of about 790° C. to about 630° C. and most preferably at a temperature in the range of about 650° C. to about 750° C. The oxygen pressure is preferably in the range of 0.075 atm to 1.0 atm $O_2$, such that the pressure is above the reaction curve 20 at all times.

Figure 3A:
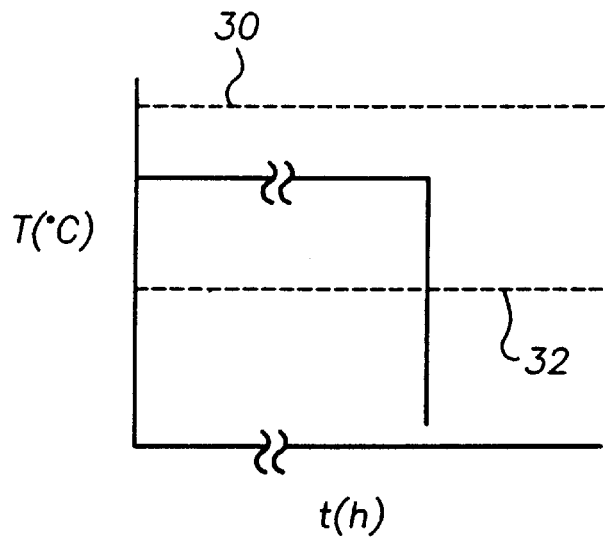
FIG. 3 is a temperature profile of the heat treatment of the invention carried out (a) in a single step; (b) as a series of steps; and (c) as a slow cooling step.
Figure 3B:
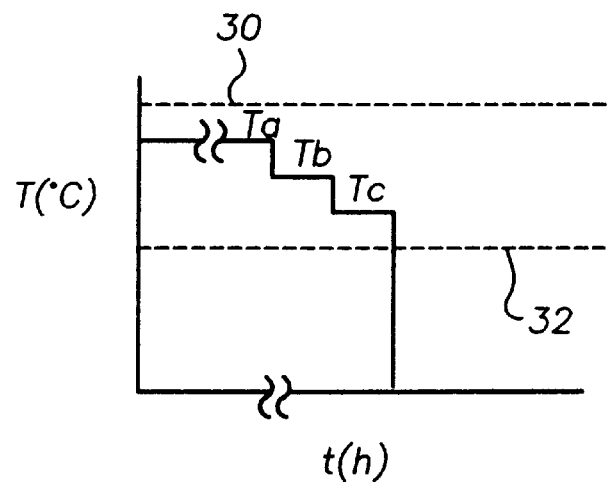
Figure 3C:
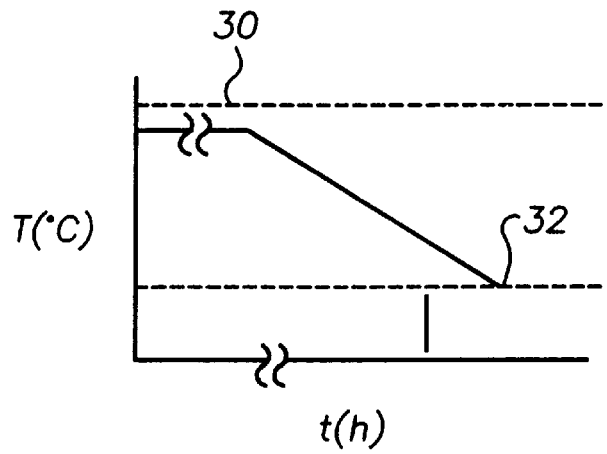

The heat treatment may be carried out in a variety of ways, as indicated in FIG. 3. The heat treatment may be a single "bake" at a single temperature (FIG. 3a) or it may be a series of shorter "bakes" as progressively lower temperatures (FIG. 3b). Alternatively, the heat treatment may be accomplished by a very slow ramp (cool down) through the temperature range of interest, so that the total dwell time in the effective temperature is achieved (FIG. 3c). Curves 30 and 32 bound the effective temperature range for the heat treatment. Preferred dwell time is greater than 20 hour and preferably greater than 30 hours.

The composite is desirably subjected to preliminary treatment in order to provide good intergranular connectivity prior to the post-formation heat treatment of the present invention. Good grain interconnectivity is accomplished by proper alignment of the oxide grains and substantially complete conversion of the oxide precursor materials into the BSCCO-2223 oxide superconductor. Conventional methods are available in the prior art to accomplish this. Suitable methods are described hereinbelow.

Figure 4:
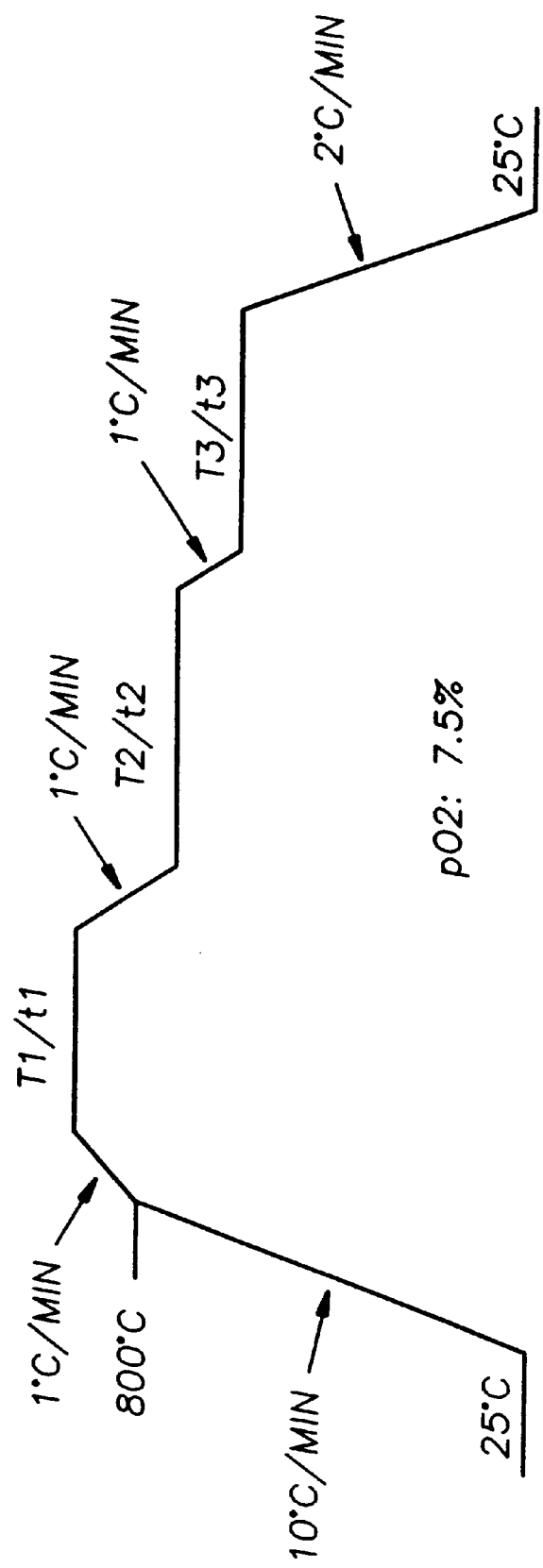
FIG. 4 is a heat treatment profile useful in preparing a (Bi,Pb)SCCO-2223 oxide superconductor.

Any conventional method may be used to prepare the (Bi,Pb)SCCO-2223 phase used in the present invention. A preferred method for preparation of a (Bi,Pb)SCCO-2223 oxide superconductor phase is a multistep heat treatment. Heat treatments at different points in the process play a different role in the manufacture of the (Bi,Pb)SCCO-2223 composite. After thermomechanical processing of the precursor oxide (typically,(Bi,Pb)SCCO-2212) into a wire of desired orientation and dimension (see below), a multistep heat treatment is carried out to convert the precursor oxide into (Bi,Pb)SCCO-2223. The first step of the heat treatment is conducted at a relatively high temperature under conditions sufficient to form a liquid phase to partially melt the oxide phase which heals cracks induced in previous deformation processing and converts (Bi,Pb)SCCO-2212 into (Bi,Pb)SCCO-2223. The second step of the heat treatment at a slightly lower temperature converts any liquid at the (Bi,Pb)SCCO-2223 grain boundaries formed in the previous heat treatment into (Bi,Pb)SCCO-2223. An optional third step of the heat treatment at an even lower temperature "cleans" the (Bi,Pb)SCCO-2223 grain boundaries (reacts away undesirable phase impurities) to obtain good intergranular connectivity and completes conversion of the precursor to (Bi,Pb)SCCO-2223. A typical heat profile is shown in FIG. 4, where $T_1$=850–800° C., and preferably 830–825° C. (40 h, 0.075 atm $O_2$), $T_2$=815–780° C., and preferably 813–805° C. (40 h, 0.075 atm $O_2$) and $T_3$=790–780° C., and preferably 787° C. (30 h, 0.075 atm, $O_2$). The interested reader is directed to co-pending application U.S. Ser. No. 08/041,822 filed Apr. 1, 1993, the contents of which are herein incorporated in its entirety by reference.

The (Bi,Pb)SCCO-2223 phase is substantially single phase 2223; however, 100% conversion may not always be obtained. Small amounts of starting materials and/or other non-superconducting phases may be present. They should not be present at levels greater than 10 vol %, and preferably less than 5 vol %.

The composite is desirably subjected to preliminary thermomechanical treatment in order to orient or texture the precursor (Bi,Pb)SCCO-2212 oxide grains before their conversion to (Bi,Pb)SCCO-2223. Known processing methods for texturing superconducting oxide composites include combination of heat treatments and deformation processing (thermomechanical processing). BSCCO-2212 superconducting oxide grains can be oriented along the direction of an applied strain, a phenomenon known as deformation-induced texturing (DIT). Deformation techniques, such as pressing and rolling, have been used to induce grain alignment of the oxide superconductor c-axis perpendicular to the plane or direction of elongation. Heat treatment under conditions which at least partially melt and regrow the BSCCO-2212 superconducting phase also may promote texturing by enhancing the anisotropic growth of the superconducting grains, a phenomenon known as reaction-induced texturing (RIT).

Typically, density and degree of texture are developed in the composite by repeated steps of deformation (to impart deformation-induced texturing) and sintering (to impart reaction-induced texturing). The steps of deforming and sintering may be carried out several times. The process may be designated by the term "nDS", in which "D" refers to the deformation step, "S" refers to the sintering or heating step and "n" refers to the number of times the repetitive process of deformation and sintering are carried out. Typical prior art processes are 2DS or 3DS processes. See, Sandhage et al. (*JOM* 21 (March, 1991)), herein incorporated by reference. A 1DS process is described in co-pending application, U.S. Ser. No. 08/468,089 filed Jun. 6, 1995 and entitled "Simplified Deformation-Sintering Process for Oxide Superconducting Articles", which is herein incorporated by reference. The nDS process may be used to orient the precursor oxide phase before its conversion into the (Bi,Pb)SCCO-2223 oxide superconductor wire.

The oxide superconductors which make up the oxide superconductor articles of the present invention are brittle and typically would not survive a mechanical deformation process, such as rolling or pressing. For this reason, the oxide superconductors of the present invention are typically processed as a composite material including a malleable matrix material. The malleable material is preferably a noble metal which is inert to oxidation and chemical reaction under conditions used in the formation and post-formation processing of the composite. Suitable nobel metals include palladium, platinum, gold, silver and mixtures thereof. In particular, silver is preferred as the matrix material because of its cost, nobility and malleability. The oxide superconductor composite may be processed in any shape, however, the form of wires, tapes, rings or coils are particularly preferred. The oxide superconductor may be encased in a silver sheath, in a version of the powder-in-tube technology. The oxide superconductor can take the form of multiple filaments embedded within a silver matrix. For further information on formation of superconducting tapes and wires, see Sandhage et al.

The advantages of the post-formation heat treatment of the present invention is demonstrated in the following examples, which are present for the purpose of illustration only and which are in no means intended to be limiting of the invention. Note that $J_c$ values are critical current density normalized to reflect the different superconducting content of the wires. $J_c$ is the critical current carried by an oxide superconductor filament. In the instance of a multifilamentary oxide superconductor wire, $J_c$ is a value obtainable by division of the total current of the oxide superconductor multifilamentary wire by the oxide superconductor cross-sectional area. $J_e$ is the critical current over the entire cross-sectional area of the multifilamentary wire, a value obtainable by division of the total current by the cross-sectional area of the wire. Comparison of $J_e$ among wires having different fill-factors is not meaningful, however, wires having the same fill factor may be readily compared.

A multifilamentary oxide superconductor tape (85 filament count) is prepared from (Bi,Pb)SCCO-2212 powders having the overall composition of Bi(1.74):Pb(0.34):Sr(1.9):Ca(2.0):Cu(3.03)as follows. Precursor powders were prepared from the solid state reaction of freeze-dried precursor of the appropriate metal nitrates having the stated stoichiometry. $Bi_2O_3$, $CaCO_3$, $SrCO_3$, $Pb_3O_4$ and CuO powders could be equally used. After thoroughly mixing the powders in the appropriate ratio, a multistep treatment (typically, 3–4 steps) of calcination (800° C. ±10° C., for a total of 15 h) and intermediate grinding was performed to homogenize the material and to generate the BSCCO-2212 oxide superconductor phase. The powders were packed into silver sheaths to form a billet. The billets were drawn and narrowed with multiple die passes, with a final pass drawn through a hexagonally shaped die into silver/oxide superconductor hexagonal wires. Eighty-five (85) wires were bundled together and drawn through a round die to form a multifilamentary round wire.

The round multifilamentary tape is heated at 760° C. for 2 hours in 0.001 atm $O_2$ and rolled to the desired thickness in a single draft process (from about 35.4 mil to about 6 mil). Heat treatment at 827° C. (0.075 atm $O_2$) for 40 h and at 808° C. (0.075 atm O2) for 40 h are used to convert the (Bi,Pb)SCCO-2212 phase into (Bi,Pb)SCCO-2223.

The effect of the temperature, oxygen content and dwell time of the post-formation heat treatment on superconducting properties, microstructure and composition were investigated. A four-point probe was used to measure critical current, with a voltage criterion of 1 $\mu$V/cm for the determination of $J_e$.

Figure 5:
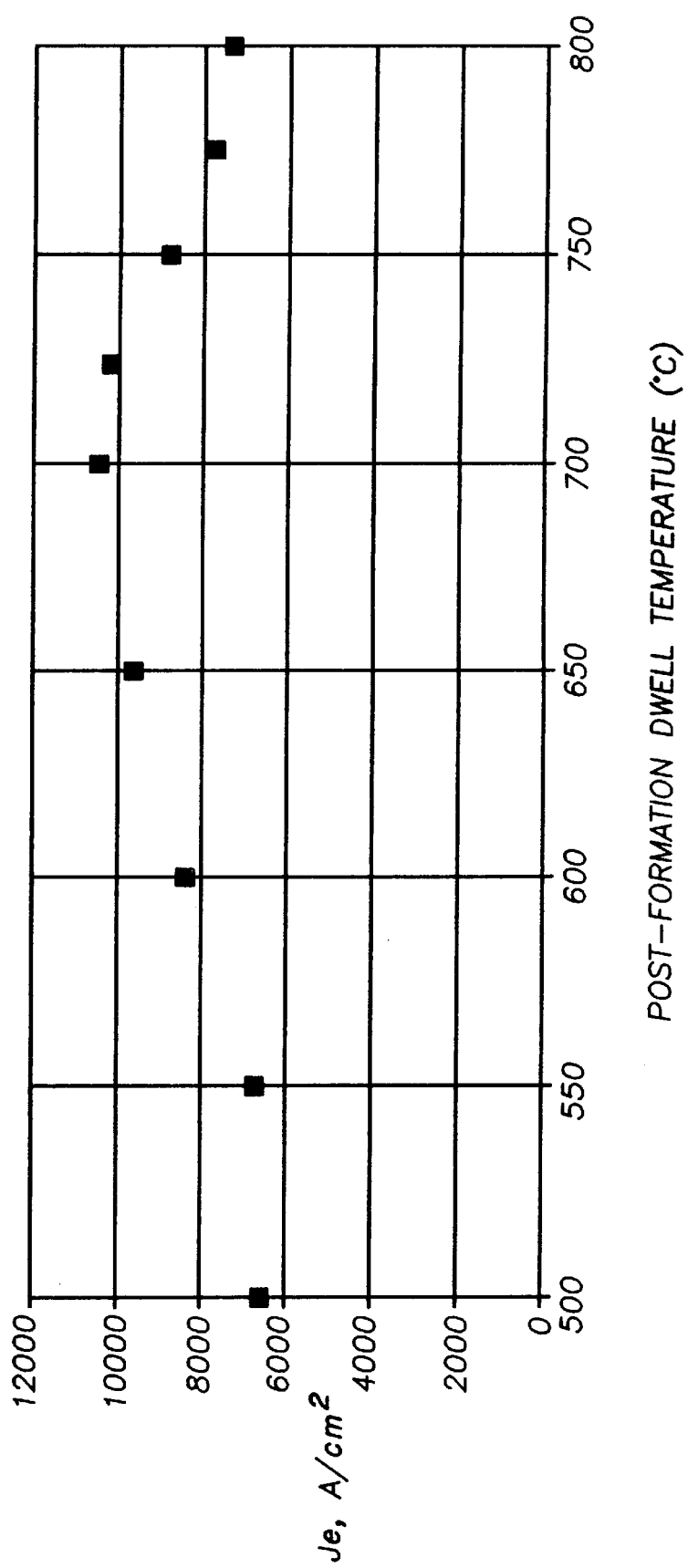
FIG. 5 is a plot of critical current density as a function of temperature (500° C. to 800° C.) in the post-formation heat treatment.

The temperature of the post-formation heat treatment was systematically varied while atmosphere and dwell time was held constant (0.075 atm $O_2$, 30 h). FIG. 5 is a plot of $J_e$ performance as a function of temperature (500° C. to 800° C.). All measured $J_e$ represented an improvement over pre-treatment performance. Optimal $J_e$ performance (ca. 11,600 A/cm$^2$) was measured at a temperature in the range of 700– 724° C. Improvements in $J_e$ represent improvements in both intragrain and intergrain characteristics of the oxide superconductor.

Figure 6:
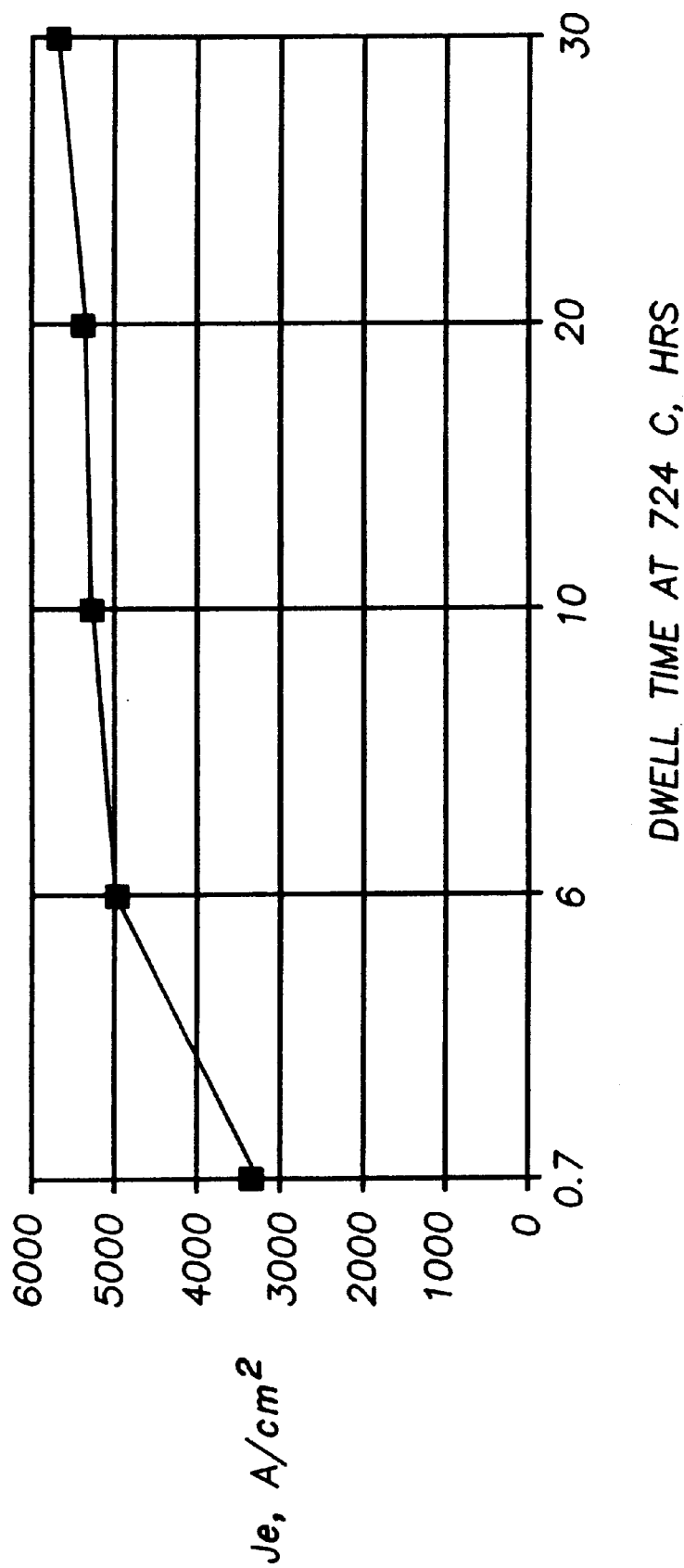
FIG. 6 heat treatment dwell time for oxide superconductor wires heat treated at 724° C. in 7.5% (0.075 atm) $O_2$.

For a different set of samples, FIG. 6 is a plot of $J_e$ as a function of dwell time for oxide superconductor wires post-formation heat treated at 724° C. in 0.075 atm (7.5%) $O_2$. Significant improvement in $J_e$ with dwell time is observed, with diminishing incremental improvement as dwell time increases above 6 h.

Figure 7:
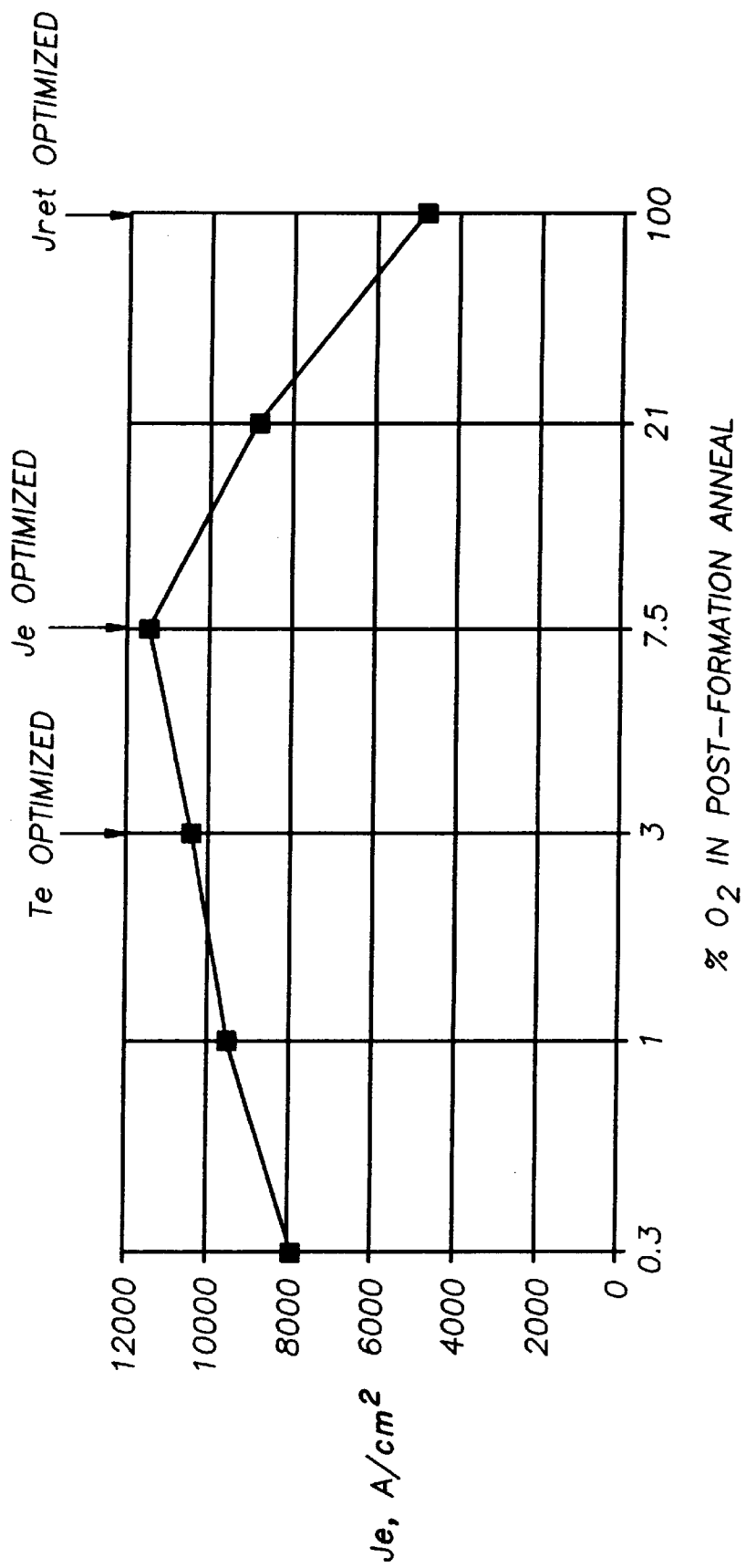
FIG. 7 is a plot of critical current density as a function of oxygen partial pressure (0.003–1.0 atm)

The oxygen partial pressure of the post-formation heat treatment also was systematically varied while temperature and dwell time was held constant (724° C., 30 h). FIG. 7 is a plot of $J_e$ as a function of oxygen partial pressure (0.003–1.0 atm). Balance of gas is inert gas, such as nitrogen or argon. Optimal $J_e$ performance (ca. 11,500 A/cm$^2$) was measured at an oxygen partial pressure in the range of 0.075 atm oxygen. Interestingly, optimal $T_c$ was obtained at lower oxygen partial pressures and optimal $J_{ret}$ was obtained at 1.0 atm oxygen. See, FIG. 7. This is a dramatic illustration of how optimization for particular intergranular and intragranular properties occurs in different processing regimes.

changes. Note that optimal $T_c$, optimal $J_c$ and optimal $J_{ret}$ result at different processing conditions. This supports the earlier observation that factors maximizing the two properties need not be identical.

TABLE 1

$T_c$, $J_e$, and $J_{ret}$ values for variously heat-treated samples.

| | parameter | | $T_{onset}$ | $\Delta T_c$ | $J_e$* | | |
|---|---|---|---|---|---|---|---|
| No. | constant | variable | (K) | (K) | (amp/cm$^2$) | $J_{ret}$ (%) | comments |
| 1 | 0.075 atm O$_2$, 30 h | 500° C. | 107 | 6.5 | 6500 | 26 | |
| 2 | 0.075 atm O$_2$, 30 h | 700° C. | 108 | 4.0 | 10,400 | 29 | |
| 3 | 0.075 atm O$_2$, 30 h | 724° C. | 108 | 3.3 | 11,600 | 32 | |
| 4 | 0.075 atm O$_2$, 30 h | 750° C. | 109 | 4.0 | 9600 | 29 | optimal $T_c$+ |
| 5 | 0.075 atm O$_2$, 30 h | 800° C. | 109 | 8.0 | 7500 | 30 | |
| 6 | 724° C., 30 h | 0.03 atm | 108 | 4.0 | 8000 | 25 | |
| 7 | 724° C., 30 h | 0.075 atm | 108 | 3.0 | 11,600 | 32 | optimal $J_c$ |
| 8 | 724° C., 30 h | 1.0 atm | 105.5 | 5.0 | 5100 | 37 | optimal $J_{ret}$ |

*$J_e$ values may only be compared within the same sample series.
+note that both sample nos. 4 and 5 have comparable $T_{onset}$; however, sample no. 4 has a smaller $\Delta T$.

In conclusion, it is apparent that temperature, oxygen partial pressure and dwell time may be varied to optimize the absolute $J_e$ performance of the (Bi,Pb)SCCO-2223 wire. A preferred post-formation heat treatment for optimal $J_e$ is at a temperature in the range of about 700° C. to 730° C.; at an oxygen partial pressure of about 0.075 atm O$_2$; and at a dwell time of at least about 20 hr, and preferably at least about 30 h. Other preferred conditions are within the scope of the invention. For example, at higher oxygen pressures, the preferred temperature should decrease and the dwell time is expected to increase.

Figure 8:
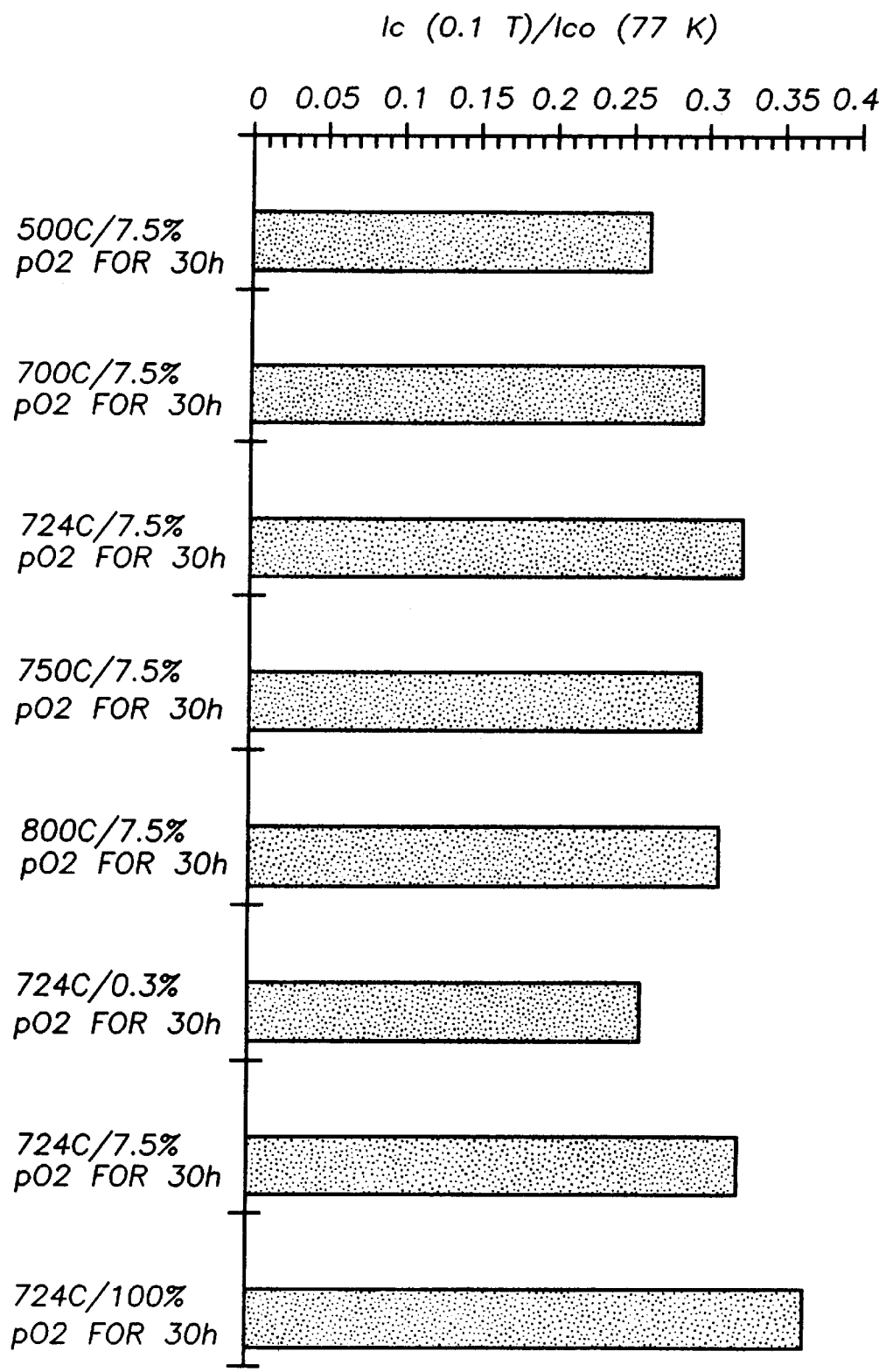
FIG. 8 is a bar graph illustrating critical current retention at 0.1 T (77 K, ⊥ tape plane) for a variety of post-formation heat treatments.

The ability for the (Bi,Pb)SCCO)-2223 wire to retain critical current in an applied magnetic field was also investigated. A (Bi,Pb)SCCO-2223 wire subjected to the heat treatment of the invention demonstrates a retention of up to about 40% and preferably about 25% to about 35% of current carrying capacity at 0.1 T (77 K, ⊥ tape surface). Field strengths of this magnitude are of interest because they are comparable to the applied field in certain applications. FIG. 8 is a bar graph illustrating $J_{ret}$ for a variety of post-formation heat treatments. All samples retained at least 25% of initial critical current density. $J_{ret}$ showed a maximum at heat treatments of 724° C./1 atm O$_2$/30 h. These $J_{ret}$ performances represent a significant improvement over performances reported in the prior art.

Figure 9:
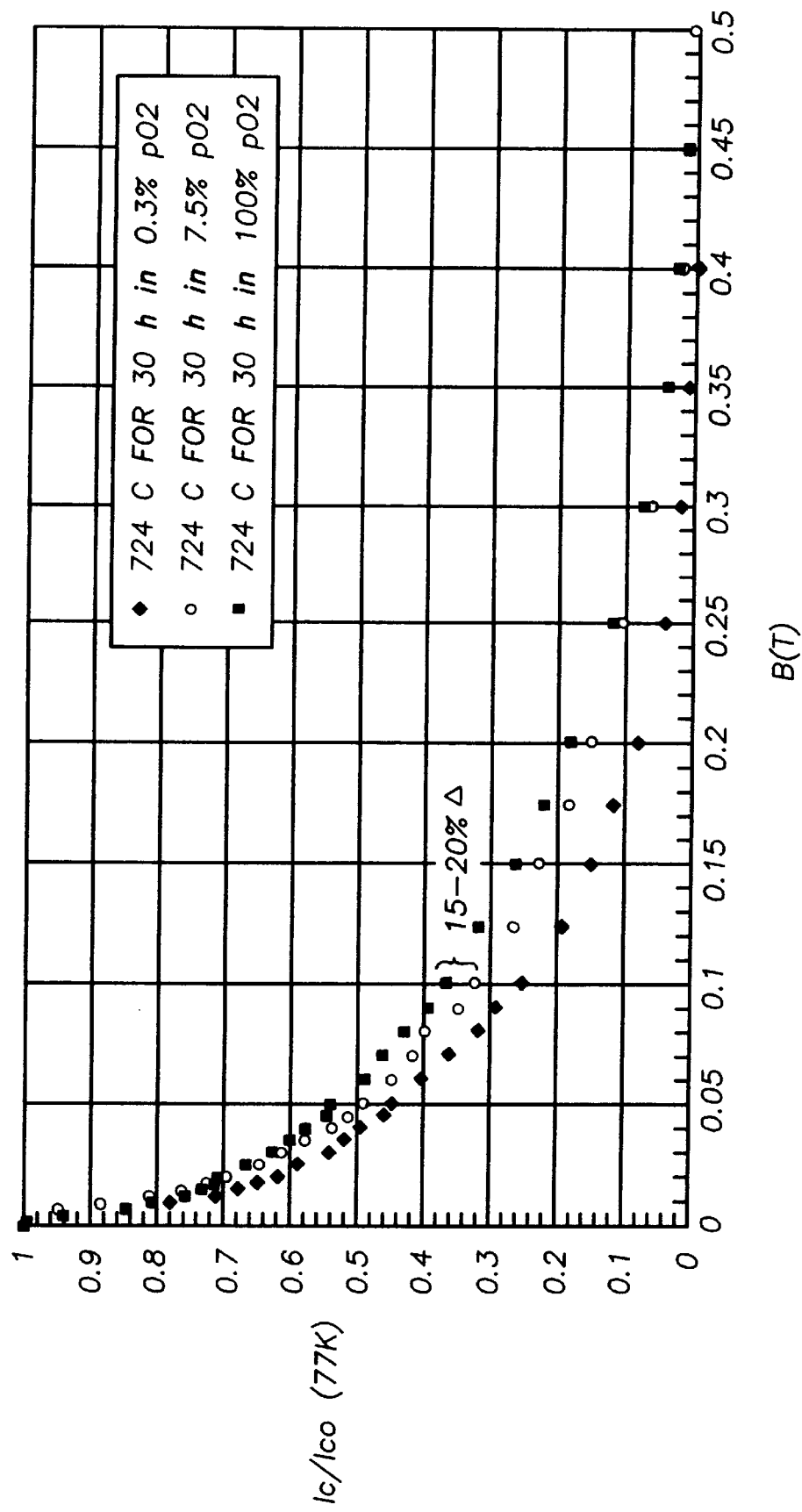
FIG. 9 is a plot of critical current retention vs. field strength for (Bi,Pb)SCCO-2223 wires post-formation heated under various oxygen partial pressures.
Figure 10:
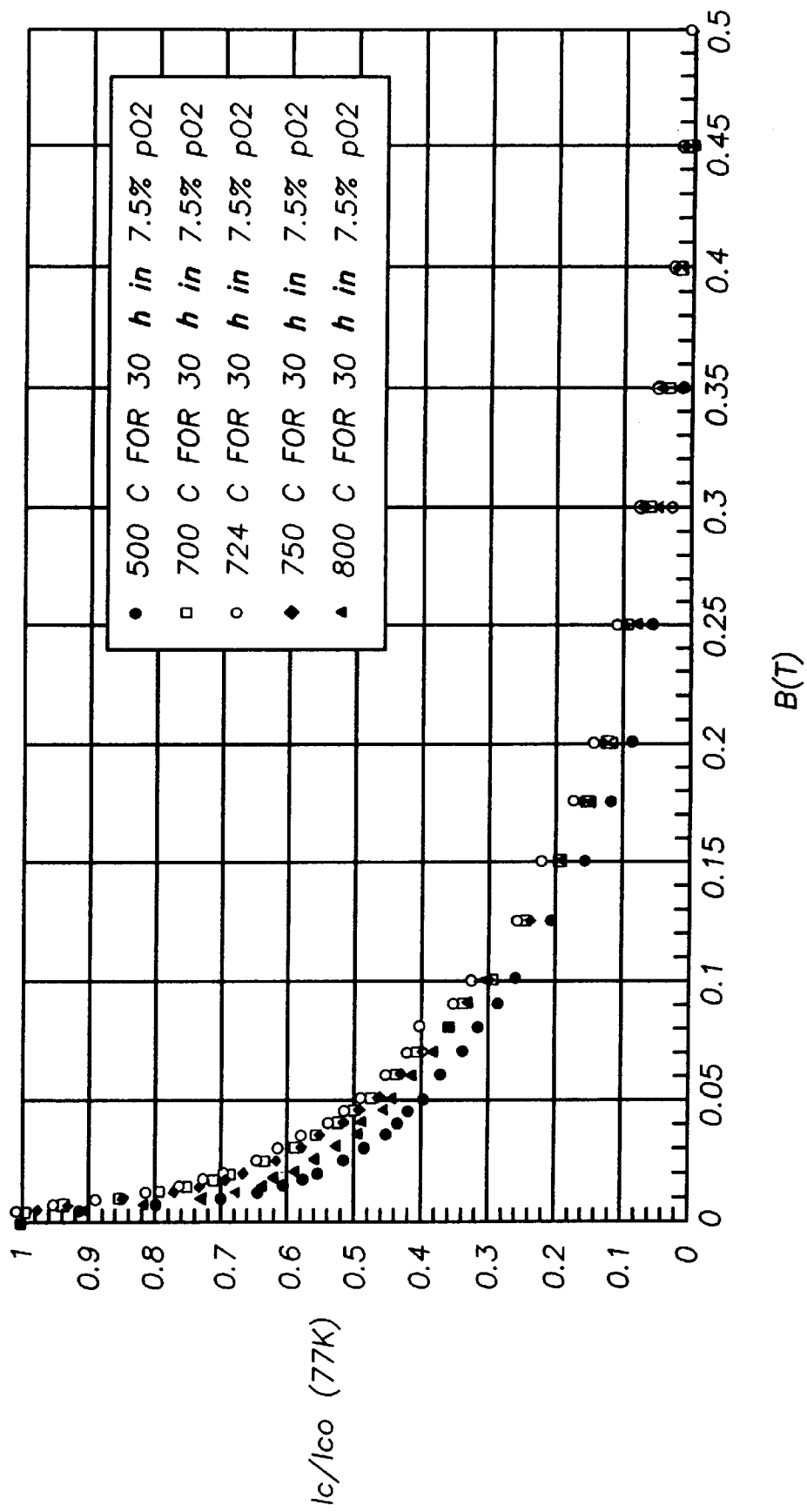
FIG. 10 is a plot of critical current retention vs. field strength for (Bi,Pb)SCCO-2223 wires post-formation heated under various temperatures.

FIGS. 9 and 10 are plots of $J_c$ retention vs. field strength for (Bi,Pb)SCCO-2223 wires heated under different oxygen partial pressures and temperatures, respectively, which demonstrate that critical current flow remains in fields up to 0.5 T.

Figure 11:
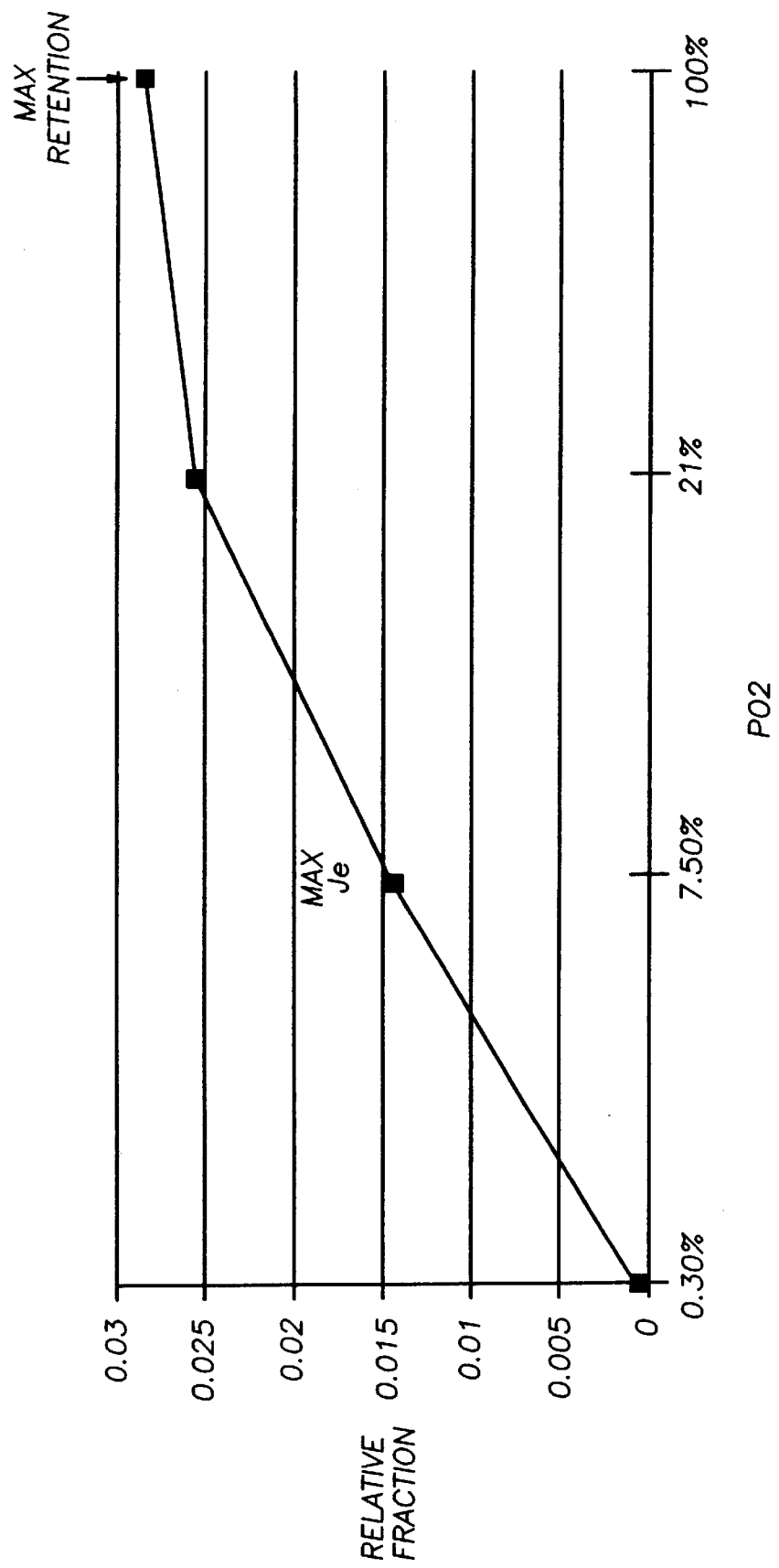
FIG. 11 is a plot of relative fraction lead-rich secondary phase as a function of oxygen partial pressure.
Figure 12:
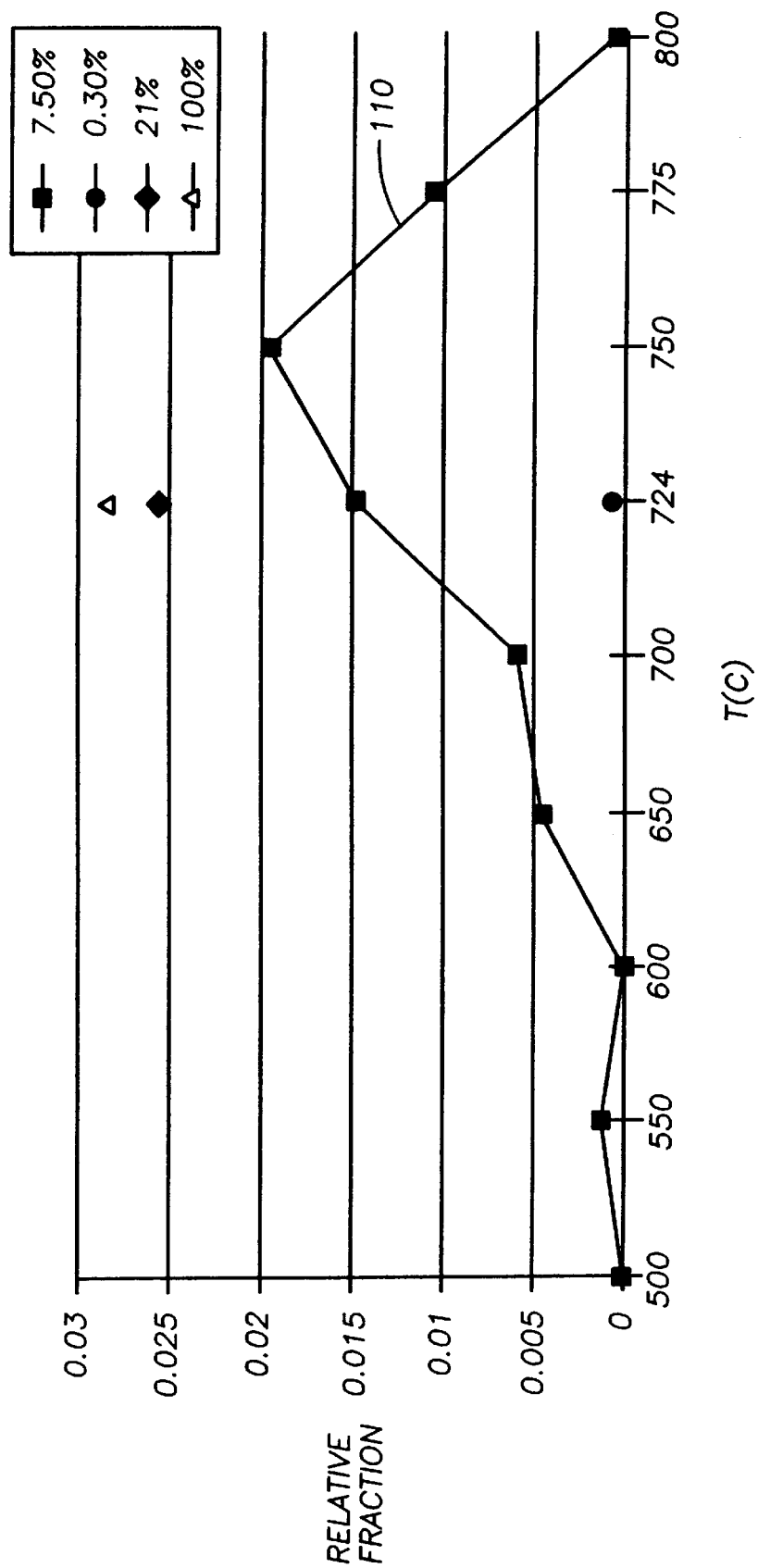
FIG. 12 is a plot of relative fraction lead-rich secondary phase as a function of temperature.

Note that samples processed for maximum $J_e$ do not necessarily also exhibit optimal critical current retention. Table 1 shows the $T_c$, $J_e$, and $J_{ret}$ values for samples held at constant pressure (0.075 atm, 30 h) at varying temperatures (Ex. 1–5) and for samples held at constant temperature (724° C., 30 h) at varying oxygen pressures (Ex. 6–8). $J_e$ values can only be compared within a samples series, as fill factor Formation of a new lead-rich non-superconducting phase is observed during the post-formation heat treatment of the invention and the amount of this phase increases with dwell time. This phase was not observed during (Bi,Pb)SCCO-2223 formation heat treatments. The appearance of the lead-rich secondary phase and the increased formation with increased dwell time correlates well with the observed improvements in $J_c$ and $J_{ret}$ in the post-formation heat treatment. FIG. 11 is a plot of the relative fraction of the lead-rich secondary phase in the final (Bi,Pb)SCCO-2223 wire as a function of oxygen partial pressure (724° C., 30 h). The relative fraction of the lead-rich phase increases with increased oxygen partial pressure. This correlates well with conditions producing the maximum critical current retention. Note that no lead rich secondary phase appears to have formed at 0.003 atm oxygen, the processing condition which optimized $T_c$. Thus, the appearance of this phase positively affects the performance of the post-formation heat treatment samples. FIG. 12 is a plot of the relative fraction of the lead rich phase as a function of temperature. Curve 110 is for samples at 0.075 atm O$_2$. Significant lead-rich secondary phase formation is observed for temperatures in the range of 724–775° C. Results from FIG. 11 (at 724° C.) are included in this plot and suggest that at higher P$_{O2}$, a greater temperature range may provide significant amounts of the lead-rich phase.

The effect of heat treatment on critical current density retention above and below the lead-rich phase stability line is demonstrated in FIG. 13. Curve 120 represents the $J_{ret}$ for samples processed under conditions above the lead-rich phase stability line. Open circle data point represent samples heat treated at 724 ° C. at 0.075 atm for 30 hours. Closed diamond data points represent samples heat treated at 724 ° C. at 1.0 atm for 30 hours. Curve 122 represents the $J_{ret}$ for samples processed at 724 ° C. at 0.003 atm for 30 hours—conditions below the lead-rich phase stability line. Performance represented by curve 122 is significantly compromised.

The lead-rich secondary phase formation and the effect of its formation on (Bi,Pb)SCCO-2223 were investigated by scanning electron microscopy (SEM) and energy dispersive spectrometry (EDS), which permitted determination of the elemental composition of both phases. The results are reported in Table 2. The relative stoichiometry of the (Bi,Pb)SCCO-2223 phase prior to the post-formation heat treatment is consistent with a nominal 2:2:2:3 stoichiometry. However, after heat treatment, the level of lead in the superconducting phase has been reduced significantly and a secondary phase rich in lead and poor in copper is formed. The relative fraction of the lead-rich secondary phase increases with dwell time and appears decorating the perimeter of the BSCCO-2223 grains. Further, the lead-rich phase appear to concentrate at the BSCCO-2223 high-energy sites.

TABLE 2

(Bi,Pb)SCCO-2223 and lead-rich phase compositions (at. %).

| compound | last heat treatment | Bi | Pb | Sr | Ca | Cu |
| --- | --- | --- | --- | --- | --- | --- |
| (Bi,Pb)SCCO-2223 | 808° C. (40 h) | 19.8 ± 0.4 | 4.9 ± 0.1 | 20.9 ± 0.3 | 23.6 ± 0.3 | 30.8 ± 0.6 |
| post-formation heat treated (Bi,Pb)SCCO-2223 | 724° C. (30 h) | 21.1 ± 0.5 | 3.8 ± 0.4 | 22.5 ± 0.6 | 22.9 ± 0.4 | 29.7 ± 1.4 |
| lead-rich phase | 724° C. (30 h) | 14.2 ± 1.5 | 17.7 ± 3.3 | 25 ± 0.9 | 27.1 ± 1.3 | 16 ± 3.6 |

Although not intending to be limited to a single interpretation, one possible explanation for the observed appearance of the lead-rich phase under conditions which also improve critical current retention is that the starting composition is overdoped with lead and that the extra lead decomposes into the lead-rich secondary phase. An alternative explanation is that the lead-rich phase is the product of oxygen content modification in the (Bi,Pb)SCCO-2223 lattice. In other words, oxygen defects are introduced into the 2223 lattice for high performance and the doped oxygen defects change the valance of the Pb in the 2223 lattice and consequently the lead-rich phase is forced to decompose out from the 2223 phase. Further, the increased flux pinning is derived from the introduction of oxygen defect Therefore, the post-formation heat treatment results in both oxygen defect formation and lead-rich phase formation, which influences both the intergranular and intragranular properties of the superconductor.

Other embodiments of the invention will be apparent to the skilled in the art from a consideration of this specification or practice of the invention disclosed herein. It is intended that the specification and examples be considered as exemplary only, with the true scope and spirit of the invention being indicated by the following claims.

What is claimed is:

1. A Bi,Pb)SCCO-2223 oxide superconductor multifilamentary composite wire, comprising:
    a plurality of (Bi,Pb)SCCO-2223 oxide superconductor filaments substantially supported in a noble metal phase, wherein the filaments include a lead-rich secondary phase containing at least 5% of the total lead (Pb) content of the oxide filaments,
    the wire characterized in that when tested over a current carrying distance of 10 cm, the wire possesses a $J_{ret}$ at 0.1 T in the range of about 15% to about 50% (77 K, ⊥ ab plane).

2. The composite of claim 1, wherein the (Bi,Pb)SCCO-2223 oxide superconductor comprises Bi:Pb:Sr:Ca:Cu in the nominal stoichiometry of 2.2(±0.05):0.4(±0.04):2.3(±0.06):2.3(±0.04):3.0(±0.15).

3. The composite of claim 1, wherein (Bi,Pb)SCCO-2223 comprises lead in the range from about 2 wt % to about 6.8 wt % of the total metal content of the oxide superconductor.

4. The oxide superconductor composite of claim 1, wherein the (Bi,Pb)SCCO-2223 phase comprises lead in the range of about 4.75 to about 5.5 percent by weight of the total metal content of the oxide superconductor.

5. The oxide superconductor composite of claim 1, wherein the (Bi,Pb)SCCO-2223 phase comprises lead in the range of about 3.4 to about 4.2 percent by weight of the total metal content of the oxide superconductor.

6. The composite of claim 1, further characterized in that an increase in $J_{ret}$ of the composite does not produce a proportional increase in $J_c$ (self field or zero field) of the composite.

7. The oxide superconductor composite of claim 1, wherein the lead-rich secondary phase is present in a relative fraction in the range of about 0.01 to about 0.5.

8. The oxide superconductor composite of claim 1, wherein the lead-rich secondary phase comprises a hexagonal crystal structure characterized by an X-ray diffraction pattern comprising the following peaks (2θ(relative intensity)): 17.9(45), 32.3(100), 31.5(62), 44.8(42), and 55.5 (45).

9. The oxide superconductor composite of claim 1, wherein the lead-rich secondary phase has a diffraction pattern substantially that described in JCPDS card No. 44-0053.

10. The oxide superconductor composite of claim 1, wherein the lead-rich secondary phase contains in the range of about 5–50% of the total lead (Pb) content of the oxide filaments.

11. The oxide superconductor composite of claim 1, wherein the lead-rich secondary phase contains in the range of about 15 to 25% of the total lead (Pb) content of the oxide filaments.

12. The oxide superconductor composite of claim 1, wherein the wire is characterized in that, when tested over a current carrying distance of 10 cm the wire possesses a $J_{ret}$ at 0.1 T in the range of about 20% to about 40%. (77 K, ⊥ ab plane).

13. A (Bi,Pb)SCCO-2223 oxide superconductor composite, comprising:
    a (Bi,Pb)SCCO-2223 oxide superconductor phase supported in a noble metal phase,
    the (Bi,Pb)SCCO-2223 oxide superconductor phase comprising a lead-rich secondary phase localized at high energy sites and a (Bi,Pb)SCCO-2223 phase, the lead-rich secondary phase containing at least 5% of the total lead (Pb) content of the oxide filaments.

14. The oxide superconductor composite of claim 13, wherein the composite is characterized in that when tested over a current carrying distance of 10 cm, the composite possesses a $J_{ret}$ at 0.1 T in the range of greater than 25% (77 K, $\perp$ ab plane).

15. The oxide superconductor composite of claim 13, the composite characterized in that when tested over a current carrying distance of 10 cm, the composite possesses a $J_{ret}$ at 0.1 T of greater than 35%.

16. The oxide superconductor composite of claim 13, wherein the composite is characterized in that when tested over a current carrying distance of 10 cm, the composite possesses a $J_{ret}$ at 0.1 T in the range of about 35% to about 50% (77 K, $\perp$ ab plane).

17. The oxide superconductor composite of claim 13, wherein the high energy site comprises one or more sites selected from the group consisting of high angle c-axis tilt boundaries, pores, interfaces between the superconducting and secondary phases and surface boundaries for the superconducting phase.

18. The oxide superconductor composite of claim 13, wherein the lead-rich secondary phase contains in the range of about 5–50% of the total lead (Pb) content of the oxide filaments.

19. The oxide superconductor composite of claim 13, wherein the lead-rich secondary phase contains in the range of about 15 to 25% of the total lead (Pb) content of the oxide filaments.

20. The oxide superconductor composite of claim 13, wherein the (Bi,Pb)SCCO-2223 comprises Bi:Pb:Sr:Ca:Cu in the nominal stoichiometry of 2.2($\pm$0.05):0.4($\pm$0.04):2.3($\pm$0.06):2.3($\pm$0.04):3.0($\pm$0.15).

21. The oxide superconductor composite of claim 13, wherein (Bi,Pb)SCCO-2223 comprises lead in the range from about 2 wt % to about 6.8 wt % of the total metal content of the oxide superconductor.

22. The oxide superconductor composite of claim 13, wherein the (Bi,Pb)SCCO-2223 phase comprises lead in the range of about 4.75 to about 5.5 percent by weight of the total metal content of the oxide superconductor.

23. The oxide superconductor composite of claim 13, wherein the (Bi,Pb)SCCO-2223 phase comprises lead in the range of about 3.4 to about 4.2 percent by weight of the total metal content of the oxide superconductor.

24. The oxide superconductor composite of claim 13, wherein the lead rich secondary phase is present in a relative fraction in the range of about 0.01 to about 0.5.

25. The oxide superconductor composite of claim 13, wherein the lead-rich secondary phase comprises a hexagonal crystal structure characterized by an X-ray diffraction pattern comprising the following peaks (2$\theta$(relative intensity)): 17.9(45), 32.3(100), 31.5(62), 44.8(42), and 55.5 (45).

26. The oxide superconductor composite of claim 13, wherein the lead-rich secondary phase has a diffraction pattern substantially that described in JCPDS card No. 44-0053.

27. A (Bi,Pb)SCCO-2223 oxide superconductor composite, comprising:
a (Bi,Pb)SCCO-2223 oxide superconductor phase supported in a noble metal phase,
the (Bi,Pb)SCCO-2223 oxide superconductor phase comprising Bi:Pb:Sr:Ca:Cu in the nominal stoichiometry of 2.2($\pm$0.05):0.4($\pm$0.04):2.3($\pm$0.06):2.3($\pm$0.04):3.0($\pm$0.15).

28. The composite claim of 27, further comprising:
a lead-rich secondary phase comprising Bi:Pb:Sr:Ca:Cu in the nominal stoichiometry of 0.9($\pm$0.09):1.1($\pm$0.21):1.6($\pm$0.06):1.7($\pm$0.08):1.0($\pm$0.23).

29. The oxide superconductor composite of claim 28, wherein the lead-rich secondary phase is present in a relative fraction in the range of about 0.01 to about 0.5.

30. The oxide superconductor composite of claim 27, wherein the composite is characterized in that when tested over a current carrying distance of 10 cm, the composite possesses a $J_{ret}$ at 0.1 T in the range of greater than 25% (77 K, $\perp$ ab plane).

31. The oxide superconductor composite of claim 27, the composite characterized in that when tested over a current carrying distance of 10 cm, the composite possesses a $J_{ret}$ at 0.1 T of greater than 35%.

32. The oxide superconductor composite of claim 27, wherein the composite is characterized in that when tested over a current carrying distance of 10 cm, the composite possesses a $J_{ret}$ at 0.1 T in the range of about 35% to about 50% (77 K, $\perp$ ab plane).

* * * * *